US006741477B2

(12) United States Patent
Sivertsen

(10) Patent No.: US 6,741,477 B2
(45) Date of Patent: May 25, 2004

(54) RACK-MOUNT APPARATUS FOR MOUNTING ELECTRONIC COMPONENTS

(76) Inventor: Clas Gerhard Sivertsen, 641 W. Johns Rd., Lilburn, GA (US) 30047

( * ) Notice: Subject to any disclaimer, the term of this patent is extended or adjusted under 35 U.S.C. 154(b) by 100 days.

(21) Appl. No.: 10/100,431

(22) Filed: Mar. 18, 2002

(65) Prior Publication Data

US 2003/0174470 A1 Sep. 18, 2003

(51) Int. Cl.[7] .............................. H05K 7/02; H05K 5/02
(52) U.S. Cl. ...................... 361/752; 361/758; 361/809; 361/810; 361/733; 312/223.1; 174/52.1
(58) Field of Search .................................. 361/728, 730, 361/733, 736, 742, 752, 758, 770, 767, 796, 807, 808–810; 174/50, 50.54, 52.1; 312/223.1, 223.2

(56) References Cited

U.S. PATENT DOCUMENTS

| | | | | |
|---|---|---|---|---|
| 4,167,772 A | * | 9/1979 | Baehne | 361/399 |
| 5,691,504 A | * | 11/1997 | Sands et al. | 174/35 R |
| 5,825,633 A | * | 10/1998 | Bujalski et al. | 361/804 |
| 5,978,232 A | * | 11/1999 | Jo | 361/796 |
| 6,377,445 B1 | * | 4/2002 | Davis et al. | 361/683 |
| 6,399,887 B1 | * | 6/2002 | Lin | 174/138 D |
| 6,424,540 B1 | * | 7/2002 | Chen et al. | 361/759 |
| 6,493,233 B1 | * | 12/2002 | De Lorenzo et al. | 361/752 |
| 6,540,927 B2 | * | 4/2003 | Nishida et al. | 216/14 |
| 6,542,372 B1 | * | 4/2003 | Paquin et al. | 361/758 |
| 6,560,119 B1 | * | 5/2003 | Katsuyama et al. | 361/752 |
| 6,669,313 B2 | * | 12/2003 | Liao | 312/7.2 |

* cited by examiner

Primary Examiner—David Martin
Assistant Examiner—Dameon E. Levi
(74) Attorney, Agent, or Firm—Merchant & Gould

(57) ABSTRACT

A rack-mount apparatus for mounting printed circuit boards and other types of electronic components is provided. A five-sided enclosure is provided for mounting one of several different types of electronic components. The enclosure includes a bottom panel having countersunk holes for mounting electronic component. The countersunk holes are arranged according to two or more mounting patterns. Mounting hardware is also provided for mounting the printed circuit board or other type of electronic component to the bottom panel without protruding from the bottom surface of the bottom panel and also providing a gap between the printed circuit board and the bottom panel as specified by the type of printed circuit board or other electronic component. The rack-mount apparatus allows many different types of printed circuit boards or electronic components to be mounted in a standard rack-mount chassis.

10 Claims, 3 Drawing Sheets

RACK-MOUNT APPARATUS FOR MOUNTING ELECTRONIC COMPONENTS

TECHNICAL FIELD

The present application generally relates to the field of enclosures for housing printed circuit boards or other types of electronic components, and more specifically relates to the field of rack-mount enclosures for mounting such devices.

BACKGROUND OF THE INVENTION

Equipment racks are utilized to house a variety of different types of electronic equipment. For instance, a rack-mount chassis installed within a rack may be utilized to hold server computers, mass storage devices, telecommunications equipment, and a wide variety of other types of electronic equipment. The Electronic Industry Association's ("EIA") standard EIA-310D sets forth the standard dimensions and specifications for cabinets, racks panels, and associated equipment utilized in standard-sized racks.

In order to mount many different types of electronic components within a rack-mount chassis, manufacturers typically make specific chassis for specific applications. Making many different kinds of rack-mount chassis, however, can be very expensive because a different physical configuration must be utilized for each different type of electronic component to be mounted. This can lead to decreased efficiency in manufacturing and a corresponding increase in cost of the rack-mount chassis. Moreover, a number of difficulties exist that make it very difficult to create a single rack-mount chassis that can be utilized to mount many different types of electronic components.

One difficulty in creating a single rack-mount chassis that can be utilized to mount many different types of electronic components results from the fact that different types of mounting hardware need to be utilized to mount different types of electronic components. In certain circumstances, the mounting hardware utilized to mount one type of electronic component may conflict with the mounting requirements of another type of electronic component. For instance, in order to mount printed circuit boards within a standard rack-mount chassis, standoffs may be welded into the bottom of the rack. Screws may then be utilized to mount the printed circuit board to the standoffs.

The use of standoffs, however, may be problematic because some types of printed circuit boards have different height requirements than other types. Therefore, a standoff of a certain height suitable for one type of board may not be utilized with certain other types of printed circuit boards. Moreover, the mounting locations for some types of printed circuit boards conflict with the mounting locations of other types. If standoffs are physically attached to the bottom panel of the rack-mount chassis, the standoffs for one type of printed circuit board may interfere with the mounting of another type of printed circuit board.

Another difficulty in creating a standard rack-mount chassis that can accommodate a wide variety of electronic component types arises when extruded tap holes are created in a bottom panel of the rack-mount chassis to mount the electronic components. Extruded tap holes are created by drilling a hole in the bottom panel of the rack-mount chassis and then threading the hole for use with a screw. While these types of holes are inexpensive to create, their use does result in the inability to mount certain types of equipment within a rack-mount chassis. Because extruded tap holes are created by drilling through a bottom portion of the rack-mount chassis, the creation of these holes creates an uneven surface where the hole has been drilled. This leaves the bottom of the chassis rough and prohibits certain types of equipment from being smoothly slid into and out of the rack-mount chassis. Therefore, the use of extruded tap holes restricts the types of electronic component types that may be mounted within a rack-mount chassis.

Therefore, in light of the above, there is a need for an apparatus for receiving and mounting a printed circuit board or other type of electronic component that can receive and mount a variety of circuit board and component types without modification.

SUMMARY OF THE INVENTION

Embodiments of the present invention solve the above-described problems by providing an apparatus for mounting a printed circuit board or other type of electronic component in a manner that allows a wide variety of printed circuit board types or electronic component types to be utilized. Generally described, embodiments of the present invention provide a rack-mount apparatus for mounting electronic components. According to one actual embodiment of the present invention, the apparatus comprises a five-sided enclosure for mounting an electronic component, including a bottom panel having countersunk holes for mounting the electronic component. According to this embodiment of the invention, mounting hardware is also provided for attaching the electronic component to the bottom panel of the rack-mount chassis through the countersunk holes. Through the use of countersunk holes, a top surface and a bottom surface of the bottom panel remain smooth and therefore allow a variety of different types of electronic components to be mounted.

According to one embodiment of the present invention, the countersunk holes in the bottom panel are arranged according to two or more mounting patterns. The mounting patterns may correspond to standard mounting patterns for mounting different types of standard printed circuit boards or other types of electronic components. In this embodiment, the printed circuit board or other type of electronic component to be mounted will include mounting locations also defined by the mounting pattern that correspond to the countersunk holes.

According to yet another embodiment of the present invention, mounting hardware is provided for affixing the printed circuit board or other type of electronic component to the bottom panel of the rack-mount chassis. According to this embodiment of the present invention, the mounting hardware may comprise a countersunk screw or other type of mounting device that allows the printed circuit board or other type of electronic component to be mounted to the bottom panel of the rack-mount enclosure without causing any protrusion from the bottom surface of the bottom panel. Additionally, the mounting hardware may also include a spacer for creating a gap between the bottom panel of the rack mount enclosure and the printed circuit board or other type of electronic component to be mounted. The gap width may be defined according to the type of electronic component. For instance, the mounting requirements for a particular type of printed circuit may indicate that the printed circuit board should be mounted a certain height off the bottom of the rack-mount enclosure. The spacer may be interposed between the printed circuit board or other type of electronic component to be mounted and the bottom panel of the rack-mount chassis to create the pre-defined gap.

Additionally, a retainer may be utilized above the printed circuit board or other type of component to be mounted to affix the printed circuit board to the bottom panel of the rack-mount chassis.

Other aspects of the invention in its various embodiments will become apparent from the detailed description that follows.

DETAILED DESCRIPTION OF AN ILLUSTRATIVE EMBODIMENT

In the following detailed description, references are made to the accompanying drawings that form a part hereof, and in which are shown by way of illustration specific embodiments or examples. These embodiments may be combined, other embodiments may be utilized, and structural changes may be made without departing from the spirit and scope of the present invention. The following detailed description is, therefore, not be taken in a limiting sense, and the scope of the present invention is defined by the appended claims and their equivalents.

Figure 1:
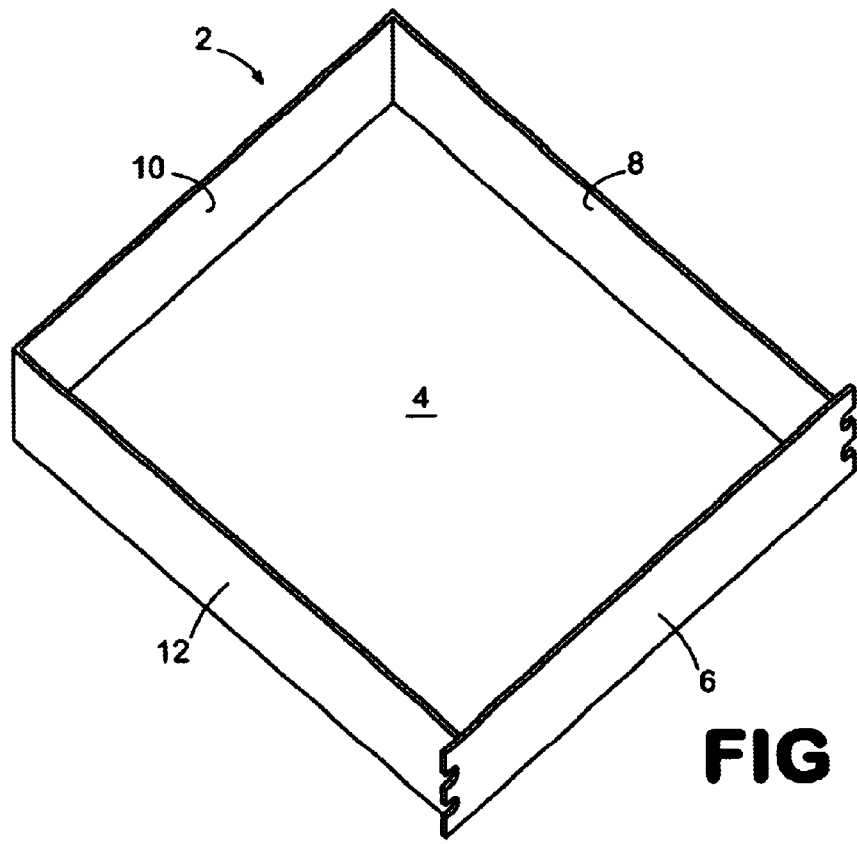
FIG. 1 is an isometric view illustrating a rack-mount chassis provided according to one embodiment of the present invention.

Referring now to FIG. 1, a rack-mount chassis 2 utilized in one actual embodiment of the present invention will be described. As shown in FIG. 1, the rack-mount chassis 2 comprises a front panel 6, a back panel 10, and side panels 8 and 12. As will be described in greater detail below, a bottom panel 4 is also provided for mounting printed circuit boards and other types of electronic components within the rack-mount chassis 2. It should be appreciated by those skilled in the art, that the rack-mount chassis 2 may be manufactured to various sizes and heights, including a single unit rack-mount chassis, a half-unit rack-mount chassis, or other standard heights. One type of standard rack-mount chassis 2 is described in the EIA Standard EIA-310-D.

Figure 2:
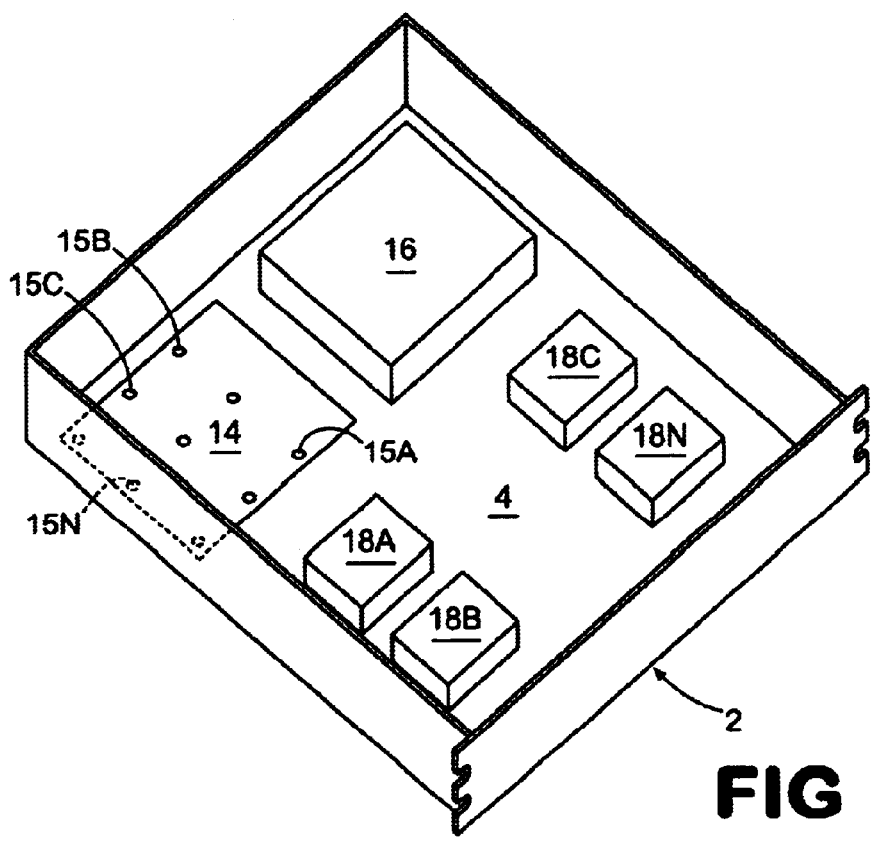
FIG. 2 is an isometric view showing a printed circuit board and other components mounted within a rack-mount chassis provided according to one embodiment of the present invention.

Referring now to FIG. 2, one illustrative use of the rack-mount chassis 2 provided according to an embodiment of the invention will be described. As shown in FIG. 2, the rack-mount chassis 2 may be utilized to hold a variety of electronic components. As shown in FIG. 2, hard disk drives 18A–18N may be mounted within the rack-mount chassis 2 along with a power supply 16 for powering the operation of the hard disk drives 18A–18N and other electronic components mounted within the rack-mount chassis 2.

Additionally, a printed circuit board 14 may be mounted within the rack-mount chassis 2. The printed circuit board 14 may include a number of mounting locations 15A–15N for affixing the printed circuit board 14 to the bottom panel 4 of the rack-mount chassis. In one particular embodiment, the printed circuit board 14 includes mounting locations 15A–15N that comprise holes. The holes in the printed circuit board 14 may be utilized in conjunction with mounting hardware to physically affix the printed circuit board 14 to the bottom panel 4 of the rack-mount chassis 2. Additional details regarding the mounting of the printed circuit board 14 to the bottom panel 4 of the rack-mount chassis 2 according to one embodiment of the present invention will be provided below with respect to FIGS. 4–6B.

Figure 3:
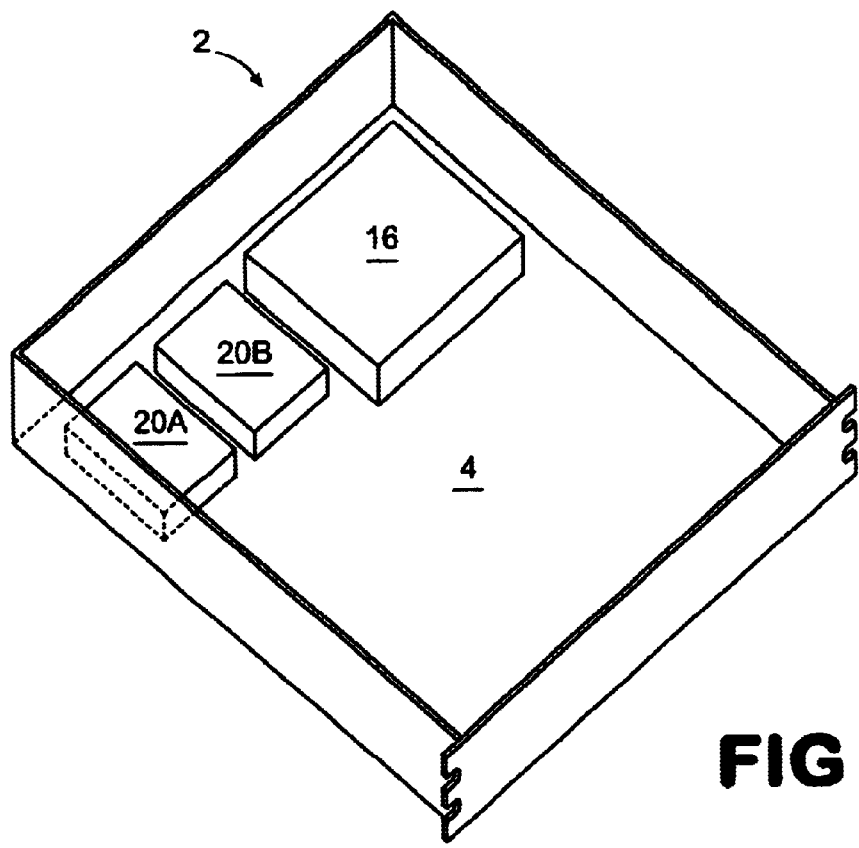
FIG. 3 is an isometric view showing several sled chassis mounted within a rack-mount chassis provided according to an actual embodiment of the present invention.

Turning now to FIG. 3, an alternate embodiment of the rack-mount chassis 2 for mounting other types of electronic components will be described. As shown in FIG. 2, a power supply 16 is mounted to the bottom panel 4 of the rack-mount chassis 2. Additionally, sled chassis 20A–20B are also mounted to the bottom panel 4 of the rack-mount chassis 2. As known to those skilled in the art, a sled chassis comprises a 5¼ inch form factor enclosure that may integrate an appropriately sized printed circuit board having a central processing unit, input/output capabilities, memory, and the other features typically found in a standard server computer. An example of a sled chassis is the SERVTRENDS 1100-N manufactured by AMERICAN MEGATRENDS, INC. of Norcross, Ga. As will be described in greater detail below, because the top surface of the bottom panel 4 is completely smooth, the sled chassis 20A–20B may be mounted in the same rack-mount chassis 2 as a printed circuit board 14 without modification.

Figure 4:
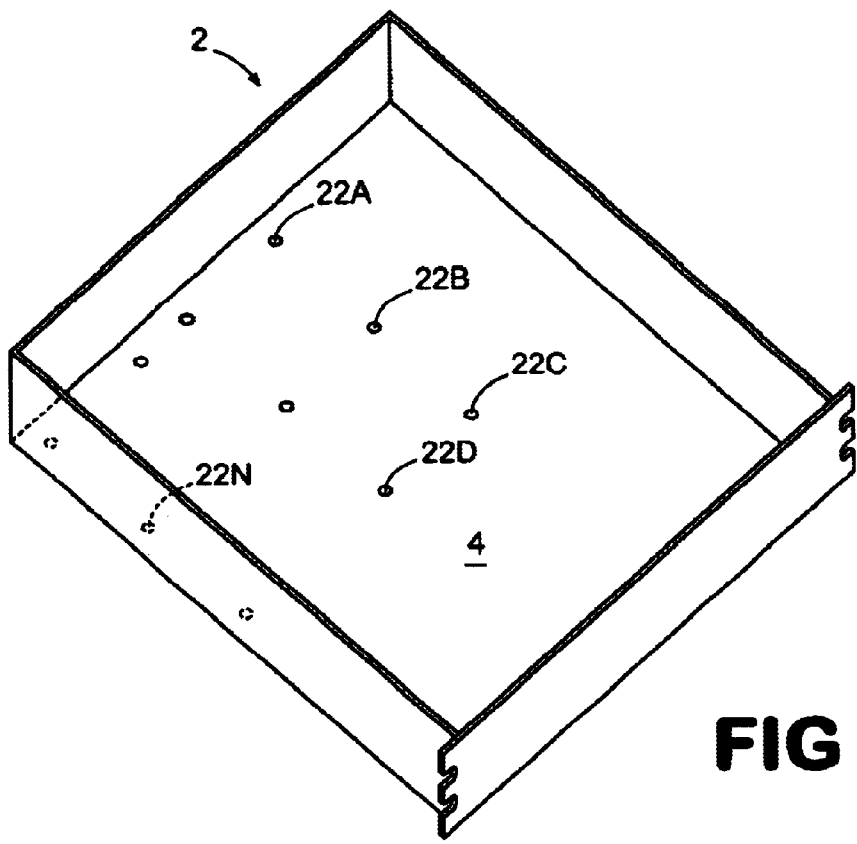
FIG. 4 is an isometric view of a rack-mount chassis provided according to one embodiment of the present invention including a number of countersunk mounting holes.

Referring now to FIG. 4, additional aspects of a rack-mount chassis 2 provided according to one embodiment of the present invention will be described. As discussed above, the rack-mount chassis 2 includes a bottom panel 4. In one embodiment of the present invention, one or more countersunk holes 22A–22N are drilled in the bottom panel 4. In particular, the countersunk holes 22A–22N are created in a manner that does not increase the thickness of the bottom panel 4. Moreover, the countersunk holes 22A–22N are created in a manner that does not increase or decrease the uniform thickness of the bottom panel 4. This allows the top surface of the bottom panel 4 to remain completely smooth. As will be described in greater detail below, the mounting holes 22A–22N are also arranged according to one or more mounting patterns.

Figure 5:
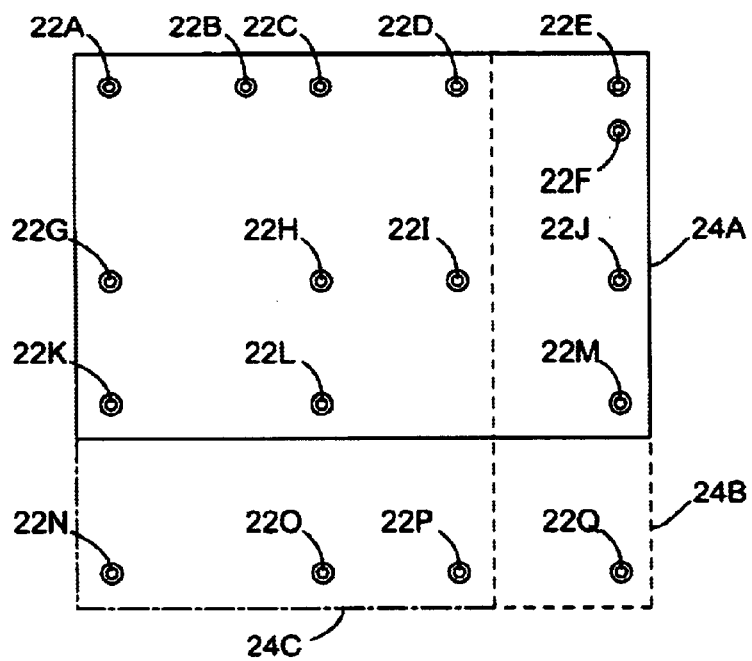
FIG. 5 is a diagram showing the locations for mounting holes according to mounting patterns utilized in one actual embodiment of the present invention.

Referring now to FIG. 5, a block diagram will be described illustrating a drilling pattern for a rack-mount chassis 2 that includes multiple mounting patterns 24A–24C. As shown in FIG. 5, the mounting holes 22A–22Q may be drilled in a manner that corresponds to two or more mounting patterns 24A–24C. In FIG. 5, the mounting pattern 24A corresponds to a "ATX" style motherboard and includes mounting holes 22A, 22C, 22F, 22G, 22H, 22J, 22K, 22L, and 22M. Mounting pattern 24B corresponds to a "full AT" motherboard mounting pattern and includes mounting holes 22A, 22B, 22C, 22E, 22G, 22H, 22J, 22N, 22O, and 22Q. Mounting pattern 24C corresponds to a "Baby AT" motherboard mounting pattern and includes mounting holes 22A, 22B, 22C, 22D, 22G, 22H, 22I, 22N, 22O, and 22P. It should be appreciated that the mounting patterns 24A–24C described herein are merely illustrative and that other types of mounting patterns may be utilized either alone or in conjunction with the mounting patterns 24A–24C.

It should also be appreciated that the mounting patterns 24A–24C typically correspond to a standard mounting pattern for mounting a printed circuit board or other type of electronic component. However, it should be appreciated that non-standard mounting patterns may also be utilized with the present invention. Moreover, non-standard mounting patterns may be utilized in conjunction with standard mounting pattern types to create a rack-mount chassis 2 that is capable of mounting both standard and non-standard component types.

Figure 6A:
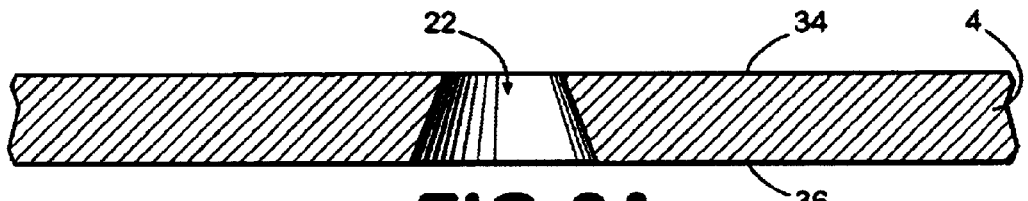
FIG. 6A is a cross section of a bottom panel utilized in a rack-mount chassis provided according to one embodiment of the present invention.

Referring now to FIG. 6A, a cross sectional view of the bottom panel 4 will be described. As shown in FIG. 4, and described briefly above, a number of mounting holes 22 are created in the bottom panel 4. The mounting holes 22 comprise countersunk holes that are located according to two or more standard mounting patterns as described above with respect to FIG. 5. Additionally, the countersunk holes 22 are created so that a thickness of the bottom panel 4 is not increased when the holes 22 are created. Moreover, the countersunk holes are created so that the top surface 34 of the bottom panel 4 remains smooth. Similarly, the bottom surface 36 of the bottom panel 4 also remains smooth, thereby allowing the rack-mount chassis 2 to be mounted in close proximity to other rack-mount equipment.

Figure 6B:
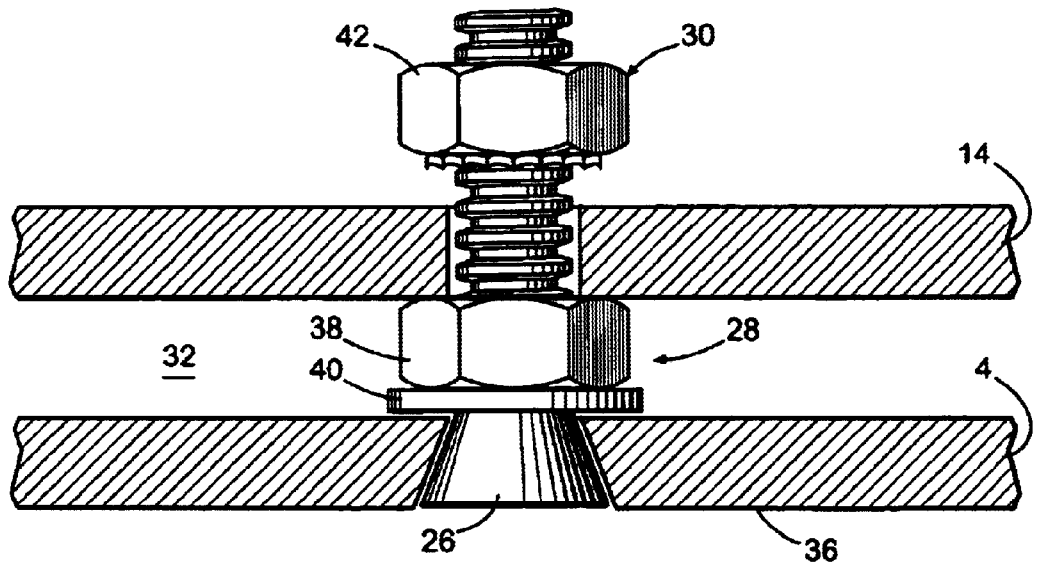
FIG. 6B is a cross section diagram showing mounting hardware utilized to affix a printed circuit board to a bottom panel of a rack-mount chassis according to one embodiment of the present invention.

Turning now to FIG. 6B, mounting hardware for affixing a printed circuit board 14 or other type of electronic component to the bottom panel 4 of the rack-mount chassis will be described. As shown in FIG. 6B, the bottom panel 4 of the rack-mount chassis 2 includes a number of countersunk holes 22. According to one embodiment of the invention, a countersunk screw 26 it utilized in conjunction with the countersunk hole 22. When the countersunk screw 26 is inserted into the countersunk hole 22, the printed circuit board 14 may be affixed to the bottom panel 4 without the mounting hardware protruding from the bottom surface of the bottom panel 4.

According to one actual embodiment of the present invention, a spacer 28 is utilized in conjunction with the countersunk screw 26 to create a gap 32 between the printed circuit board 14 or other type of electronic component and the bottom panel 4. According to this embodiment of the present invention, the width of the gap 32 is defined according to the type of printed circuit board 14 or other type of electronic component. In particular, one type of printed circuit board 14 may require a certain height between the bottom panel 4 and the printed circuit board 14. The use of a spacer 28 of a particular height will create the appropriate gap 32. According to one actual embodiment of the present invention, the spacer 28 may comprise a nut 38 and one or more washers 40 compatible and threaded for use with the countersunk screw 26.

Once the spacer 28 has been installed, the printed circuit board 14 or other type of electronic component to be mounted within the rack-mount chassis 2 may be installed. Once the printed circuit board 14 has been installed, a retainer 30 may be utilized in conjunction with the countersunk screw 26 to removably affix the printed circuit board 14 to the bottom panel 4. According to one actual embodiment of the present invention, the retainer 30 comprises a nut and washer combination 42. It should be appreciated that countersunk screws 26 may be utilized in each of the mounting holes 22A–22N and the bottom panel 4 of the rack-mount chassis 2. In this manner, the printed circuit board 14 or other type of electronic component to be affixed to the bottom panel 4 may be securably mounted at each of the mounting locations 15A–15N.

Based on the foregoing, it should be appreciated that the present invention provides a rack-mount apparatus for mounting printed circuit boards and other types of electronic components. The above specification, examples and data provide a complete description of the manufacture and use of the composition of the invention. Since many embodiments of the invention can be made without departing from the spirit and scope of the invention, the invention resides in the claims hereinafter appended.

I claim:

1. A rack-mount apparatus for mounting electronic components, said apparatus comprising:

a five sided enclosure for mounting a first electronic component having mounting locations defined by a first mounting pattern or a second electronic component having mounting locations defined by a second mounting pattern, said enclosure including a bottom panel having countersunk holes arranged according to the first mounting pattern and the second mounting pattern.

2. The apparatus of claim 1, further comprising mounting hardware for removably attaching said electronic component to said bottom panel and wherein said mounting hardware does not protrude from a bottom surface of said bottom panel.

3. The apparatus of claim 2, wherein said countersunk holes do not increase a thickness of said bottom panel.

4. The apparatus of claim 3, wherein said mounting hardware comprises a countersunk screw.

5. The apparatus of claim 4, wherein said mounting hardware further comprises a spacer for creating a gap between said bottom panel and said electronic component, the width of said gap defined according to the type of said electronic component.

6. The apparatus of claim 5, wherein said mounting hardware further comprises a retainer for removably affixing said printed circuit board to said bottom panel.

7. An apparatus for mounting electronic components, said apparatus comprising:

a rack-mount chassis including a bottom panel having a plurality of countersunk holes, the locations of said countersunk holes being defined by two or more standard mounting patterns for said electronic components; and mounting hardware for affixing an electronic component having mounting locations corresponding to one of the standard mounting patterns to the bottom panel through said countersunk holes without protruding from a bottom surface of said bottom panel.

8. The apparatus of claim 7, wherein said mounting hardware comprises a countersunk screw and a spacer for creating a gap between said bottom panel and said electronic component, said gap defined according to a type of said electronic component.

9. The apparatus of claim 8, wherein said two or more mounting patterns comprise standard mounting patterns for mounting printed circuit boards.

10. The apparatus of claim 9, wherein said bottom panel has a uniform thickness and wherein said countersunk holes do not increase said uniform thickness.

* * * * *

UNITED STATES PATENT AND TRADEMARK OFFICE
CERTIFICATE OF CORRECTION

PATENT NO. : 6,741,477 B2  
APPLICATION NO. : 10/100431  
DATED : May 25, 2004  
INVENTOR(S) : Clas Gerhard Sivertsen Page 1 of 1

It is certified that error appears in the above-identified patent and that said Letters Patent is hereby corrected as shown below:

Title Page, Item (73) Assignee should read: --American Megatrends, Inc.--

Signed and Sealed this  
Twelfth Day of February, 2013

Teresa Stanek Rea  
*Acting Director of the United States Patent and Trademark Office*